(12) United States Patent  (10) Patent No.: US 6,747,445 B2
Fetterman et al.  (45) Date of Patent: Jun. 8, 2004

(54) STRESS MIGRATION TEST STRUCTURE AND METHOD THEREFOR

(75) Inventors: H. Scott Fetterman, New Tripoli, PA (US); Vivian Ryan, Washington, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/007,904

(22) Filed: Oct. 31, 2001

(65) Prior Publication Data

US 2003/0082836 A1 May 1, 2003

(51) Int. Cl.[7] .................. G01N 27/24; H01L 21/66; H01L 23/58
(52) U.S. Cl. ................. 324/71.1; 438/18; 257/48
(58) Field of Search .................. 257/48; 438/14, 438/17, 18; 324/71.1, 71.5

(56) References Cited

U.S. PATENT DOCUMENTS

| | | | |
|---|---|---|---|
| 3,974,443 A | 8/1976 | Thomas | 324/64 |
| 4,024,561 A | 5/1977 | Ghatalia | 357/23 |
| 4,319,396 A | 3/1982 | Law et al. | 29/571 |
| RE32,625 E | 3/1988 | Schwarz et al. | 374/57 |
| 4,801,869 A | 1/1989 | Sprogis | 324/73 |
| 4,918,377 A | 4/1990 | Buehler et al. | 324/691 |
| 5,049,811 A | 9/1991 | Dreyer et al. | 324/158 |
| 5,244,839 A | 9/1993 | Baker et al. | 437/205 |
| 5,264,377 A | 11/1993 | Chesire et al. | 437/8 |
| 5,268,329 A | 12/1993 | Chittipeddi et al. | 437/195 |
| 5,300,307 A | 4/1994 | Frear et al. | 427/96 |
| 5,318,924 A | 6/1994 | Lin et al. | 437/192 |
| 5,514,974 A | 5/1996 | Bouldin | 324/763 |
| 5,798,300 A | 8/1998 | Chittipeddi et al. | 438/627 |
| 5,872,018 A * | 2/1999 | Lee | 438/18 |
| 5,900,735 A * | 5/1999 | Yamamoto | 324/537 |
| 5,930,587 A * | 7/1999 | Ryan | 438/14 |
| 5,972,179 A | 10/1999 | Chittipeddi et al. | 204/192.17 |
| 6,570,181 B1 * | 5/2003 | Graas et al. | 257/48 |

OTHER PUBLICATIONS

Matsunaga et al., "Accurate, Non–Time–Intensive Evaluation of the Stress–Migration Endurance for Layered Al Interconnects", Apr. 1994, Reliability Physics Symposium, 1994. 32$^{nd}$ Annual Proceedings., IEEE International, pp. 256–260.*

(List continued on next page.)

*Primary Examiner*—Evan Pert

(57) ABSTRACT

A stress migration test structure is provided that can be used to detect stress migration defects in traces or conductors of integrated circuits. The stress migration test structure can be placed between die areas on a wafer, or on a die. On the die, a stress migration test structure can be placed in otherwise unused areas of a die such as between bond pads and the periphery of a die, in a layer beneath bond pads, in a region between the bond pads and the perimeter of standard area for circuit layout, or in regions in more than one level of the integrated circuit. The stress migration test structure may also be placed within the standard area for circuit layout and used, with some additional circuitry, as a stress migration test structure on an integrated circuit once the die is packaged. Obtaining information from the impedance segments of a stress migration test structure can be accomplished employing either a mechanical stepping or an electrical stepping technique.

41 Claims, 10 Drawing Sheets

OTHER PUBLICATIONS

Hoang et al., "Wafer Level Reliability Assessment of Stress–Induced Voiding", Jun. 1991, VLSI Multilevel Interconnection Conference, 1991, Proceedings. Eighth International IEEE, pp. 387–389.*

Hinode et al., "Mechanism of Stress–Induced Migration", Jun. 1988, VLSI Multilevel Interconnection Conference, 1988. Proceedings., Fifth International IEEE, pp. 429–435.*

R.M. Warner (editor), Integrated Circuits Design Principles and Fabrication, 1965, McGraw–Hill Book Company, p. 128.*

Technical Memorandum, "Acceleration of Stress–Migration Failure in Aluminum Interconnect," V. Ryan et al., AT&T Bell Laboratories, Jun. 17, 1992.

Journal of Electronic Materials, vol. 24, No. 6, 1995, "Enhanced Stress–Migration Reliability for ULSI Interconnect: An Insight into the Perils of Screening Al Depositions Based on Grain Size," V. Ryan et al., pp. 969–974.

Circuits and Devices, "Stress–Voiding of Narrow Conductor Lines," F. G. Yost and F. E. Campbell, 1990 IEEE, pp. 40–44.

* cited by examiner

STRESS MIGRATION TEST STRUCTURE AND METHOD THEREFOR

TECHNICAL FIELD

This invention relates to integrated circuits, and in particular to an improved test structure for determining stress migration characteristics of conductors in integrated circuits.

BACKGROUND OF THE INVENTION

The reliability of integrated circuits is a significant factor in their production and use. During the manufacturing process, process parameters are controlled to ensure high reliability in all stages of the manufacturing process. Where feasible, tests are performed at intermediate stages of production so corrective action can be taken if necessary. The importance of precise control of parameters will be appreciated when it is realized that integrated circuit manufacture requires hundreds of steps. The steps typically process one or more wafers, each containing multiple integrated circuits, or chips. Completion of all steps for each wafer typically requires several weeks. A large inventory of very valuable product is in process at any point in time. Should a process parameter be out of specification, it may be several weeks before it is discovered, thereby resulting in a significant economic loss of wafers in-process and in time to getting product to market.

One area of concern is the stress migration characteristics of traces or conductors, such as metal (e.g. aluminum, aluminum alloys, refractory metal, copper, copper alloys, gold, gold alloys, silver, silver alloys, etc.) and doped polysilicon, in an integrated circuit. Stress migration is the movement of atoms of the material from which the conductor is fabricated, leaving behind voids that enlarge over time, due to the stress of being confined within a more rigid structure such as an insulator, and more specifically an oxide.

FIG. 9 shows a scanning electron microscope photograph of a stress migration void 910 in an aluminum alloy trace or conductor 920 in an integrated circuit. In FIG. 9, the conductor is viewed from the top surface, either through a transparent/translucent oxide, or with the oxide removed. The stress migration void does not, at the time of the photograph, extend across the entire width of the conductor.

Stress migration voids enlarge over time as a function of the inverse cube of the width of a cross-section of the conductor. FIG. 10 illustrates a cross section of an aluminum alloy trace or conductor 1010 of width w and height h on a substrate illustrated as silicon wafer 1020, covered by a dielectric, such as a layer of silicon oxide 1040. A glue layer 1030 of titanium nitride on titanium may be employed to prevent the aluminum from diffusing into the silicon and also to better adhere the aluminum alloy conductor to the underlying substrate 1020.

As illustrated in FIG. 10, metal traces 1010 in integrated circuits are often formed on a semiconductor substrate 1020, such as silicon, with a so-called glue layer 1030 of another conductive material, such as titanium tungsten or titanium nitride, therebetween, as is known in the art. Layer 1030 is a layer that enhances the adherence of metal trace 1010 to substrate 1020 and prevents the reaction of the metal trace 1010 with substrate 1020. For a technology with a minimum line width of 0.5 microns, a metal trace 1010 is typically 0.5 microns thick (dimension h), and 0.5 microns wide (dimension w). In the same technology, layer 1040 is typically 0.5 microns thick (dimension t). Since both metal trace 1010 and layer 1030 are conductive, they form two parallel impedance paths for current conduction and results in a conduction path impedance that is the combined impedance of metal trace 1010 and layer 1030. Thus, even in the presence of a stress migration void in the metal trace 1010 that extends completely through a metal trace 1010, a conduction path can remain through layer 1030, albeit the impedance will be greater than if metal trace 1010 were available to provide a parallel current conduction path.

When a stress migration void is present in metal trace 1010, the impedance of the conduction path is impacted by the presence of the stress migration void. The impedance of the conduction path varies based on many factors, including but not limited to, whether stress migration voids are present, the extent to which stress migration voids that are present extend through the trace or glue layer, whether the trace is fabricated of one or more than one conduction paths, the sheet resistance or per unit impedance of the materials of which the conduction path is fabricated, and the height and width dimensions of the cross section of the conduction path or parallel conduction paths.

A need exists for a stress migration test structure and method of determining stress migration voids that can be used in manual or automated processes to determine the presence of stress migration voids in conduction paths such as traces on an integrated circuit. Such a stress migration test structure and method could be useful both at wafer test and package test. The stress migration test structure could be a stand-alone structure or could be a cell in an integrated circuit such that even after the integrated circuit is packaged, stress migration voids in the stress migration test structure within the integrated circuit could be evaluated. The number and severity of stress migration voids in the conductors of a stress migration test structure could be used as indicia to infer the viability of all conductors located on a chip, on a wafer, or on an integrated circuit.

SUMMARY OF THE INVENTION

In accordance with the present invention, a stress migration test structure is provided that can be used to detect stress migration defects such as voids in metal conductors of integrated circuits. The stress migration test structure can be placed between die areas on a wafer, or on a die. On the die, a stress migration test structure can be placed in otherwise unused areas of a die such as between bond pads and the periphery of a die, in a layer beneath bond pads, in a region between the bond pads and the perimeter of standard area for circuit layout, or in regions in more than one level, such as metal, of the circuitry on a die. The stress migration test structure may also be placed within the standard area for circuit layout and used, with some additional circuitry, as a stress migration test structure on an integrated circuit once the die is packaged. Obtaining information from the impedance segments of a stress migration test structure can be accomplished employing either a mechanical stepping or an electrical stepping technique.

DETAILED DESCRIPTION

Figure 1:
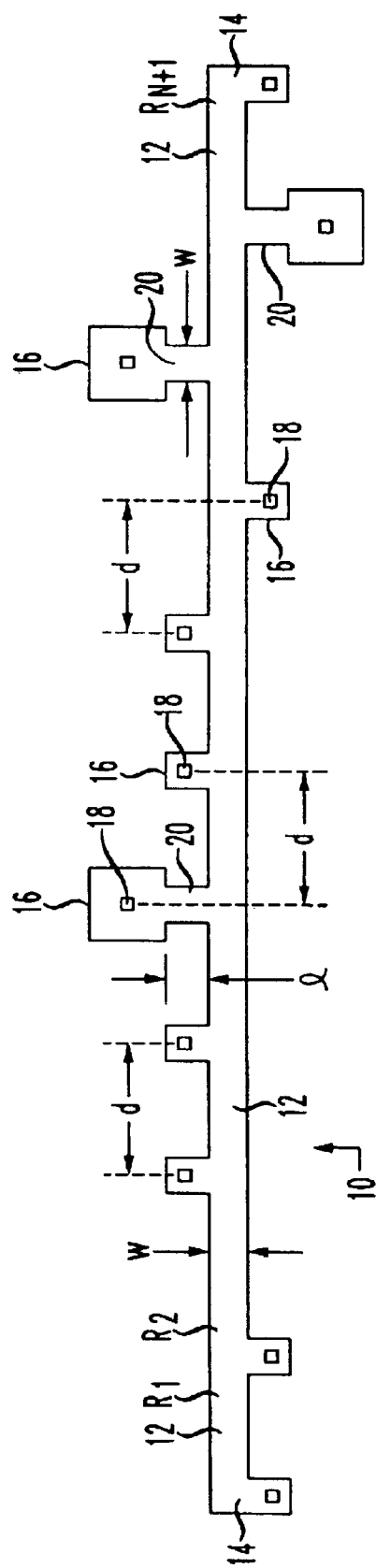
FIG. 1 is an illustrative embodiment stress migration test structure capable of detecting stress migration voids in accordance with the present invention.

An illustrative embodiment of a stress migration test structure 10 in accordance with the present invention is shown in FIG. 1. The stress migration test structure advantageously employs a metal runner having taps defining resistors, impedance segments, or resistor segments having an impedance magnitude that results in stress migration voids, if present, being a substantial influence on the impedance, or resistance, between any two taps between which a stress migration void occurs. The term impedance will be used, however, it is realized that the metal runner illustrated exhibits a resistance. In the illustrative embodiment, the stress migration test structure 10 is a metal runner 12 forming a plurality of resistors 14 each of substantially the same impedance. However, resistors 14 may be of different values of impedance as long as there is a method to identify the expected impedance. The metal runner 12 is suitable for fabrication in the form of a monolithic integrated circuit. The number of resistors is designated as n, a user determined number. The resistors 14 are designated as $R_1$ through $R_n$ and a reference to a resistor generally may be to resistor $R_i$. Resistors 14 each have an impedance that is application dependent and, in part, are dependent on the magnitude of stress migration voids present that are desired to detect.

As illustrated in the illustrative embodiment in FIG. 1, stress migration test structure 10 is a thin film metal runner 12 that has a known or measurable sheet resistance per square of metal forming runner 12. The sheet resistance of a square of uniform thickness metal is constant without regard to the length of an edge of the square. The resistors 14 are typically a thin film metal resistor of aluminum on a silicon substrate forming an integrated circuit, although the invention is not limited thereto. A typical sheet resistance value is on the order of 0.04 ohms per square. Taps 16 typically extend from metal runner 12 at each end as well as at intervals of known resistance. In a preferred embodiment, taps 16 extend from metal runner 12 at each end as well as at substantially equal intervals. Taps 16 may have various shapes and may couple to a via 18. If the metal runner is ideal, that is the metal runner has no stress migration voids, is of uniform thickness, width, and resistance per unit-square, and has taps that are uniformly spaced along the runner, then the impedance of any resistor $R_i$, between any two taps, will be the same as the impedance of any other resistor formed in metal runner 12. That is, the impedance of any resistor 14 in stress migration test structure 10 will be the same as the impedance of any other resistor 14 in stress migration test structure 10.

In order for a resistor string to be useful as a stress migration test structure, the resistor string must be of sufficient length to develop axial stress above the threshold for nucleating voids. The length of the resistor string that is of sufficient length to develop axial stress above the threshold for nucleating voids would differ for each line width technology. For typical complementary metal oxide semiconductor 0.35-micrometer line width technology, a resistor length of at least approximately 100 micrometers is required. Other considerations for practical use of a resistor string as a stress migration test structure include a minimum length to saturate steady-state void size of approximately 400 micrometers and a minimum length to saturate rate-of-void-growth of approximately 2,000 micrometers. Longer length resistor strings, or many replicate patterns, would result in more data on which to base statistical evaluations, with little additional gain for a resistor string having a length of approximately 20,000 micrometers. Thus, typical resistor string lengths would range from 400 micrometers to 20,000 micrometers for 0.35 micrometer line width technology.

As illustrated in FIG. 1, the width, w, of metal runner 12 forming a resistor string conductor is preferably the minimum line width permitted by the design rules for the particular technology. The minimum distance, d, between taps preferably encompasses at least ten crystallographic grains of the metal of which the metal runner is fabricated. Furthermore, the tap conductor extending to a via (used to provide intermediate tap to the resistor string) is preferably of the minimum line width permitted by the design rules for the technology to avoid perturbing axial stress in the resistor string. In addition, the length, l, of a tap conductor 20 extending from the resistor string to a via must be kept short, preferably no longer than 10 micrometers to minimize or avoid stress migration in the tap conductor 20.

A combination of factors, not just the size of the metal runner alone, accounts for the ability of the stress migration test structure 10 to detect stress migration voids, and concomitantly permits an inference of the presence or absence of stress migration voids in other conductors similarly manufactured. The factors include the voltage across the resistance string, the voltage measurement resolution of the test hardware, the expected magnitude of impedance deviation from the ideal impedance expected in the presence of a stress migration void, the probability of finding a stress migration void in a length of metal runner between two adjacent taps, and the desired confidence that the resistor string is free of stress migration voids. A stress migration void can be detected by placing a tolerance on the measured impedance between any two adjacent taps of the stress migration test structure, as compared to an ideal expected impedance, or an average of the individual resistor impedances where the taps are uniformly spaced. The magnitude of the tolerance is one factor in determining the size of stress migration voids detected. The tolerance is determined empirically by determining the minimum stress migration void size for maintaining mechanical integrity of structural materials surrounding the void, by acceptable degradation in electromigration design rules, and by acceptable change in resistance according to electrical design consideration. Typically, 25 percent line width or cross-section penetration is the maximum allowable void size. The number of resistors, $R_n$, in the runner of stress migration test structure 10 is dependent on the probability of growing a void in any unit of runner length, which depends on the microstructure of the metal including the crystallographic grain size (local ordered arrangement or atoms, e.g., cubic symmetry, face-centered cubic, body-centered cubic, hexagonal, etc.) thickness of the metal, mechanical stress for barrier layer, anti-reflection coatings on top of runner, and modulus for dielectric coating overlying the metal runner.

The stress migration test structure 10 as illustrated in FIG. 1 is shown with a metal runner that extends in a straight line, although the invention is not limited thereto. In some applications, the aspect ratio of the space available for fabrication of stress migration test structures may not accommodate a metal runner that extends in a straight line. A metal runner that takes on other shapes may be utilized. For example, a metal runner may include one or more direction changes or reversals, which increases the difficulty of maintaining the resistance of each of the resistors substantially the same.

Figure 2:
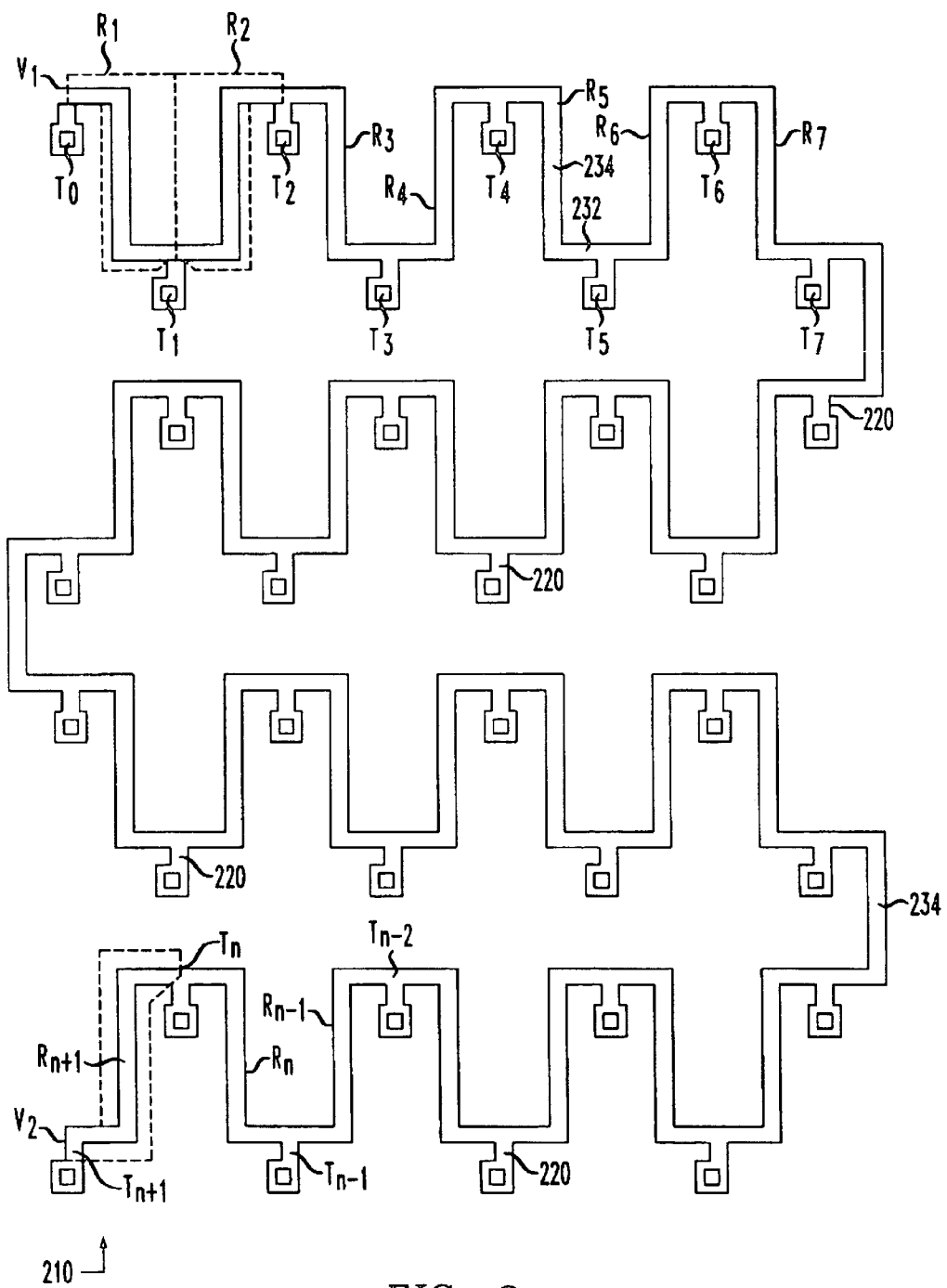
FIG. 2 is an alternate illustrative embodiment stress migration test structure capable of detecting stress migration voids in accordance with the present invention in which the stress migration test structure serpentines boustrophedonically back and forth, including several direction reversals.

Referring to FIG. 2, an alternate embodiment stress migration test structure 210 in which metal runner 234 serpentines boustrophedonically back and forth is illustrated. Taps $T_0, T_1, T_2, T_3, \ldots, T_{n+1}$, and $T_{n+1}$ extend from metal runner 234 at substantially equal resistance intervals. When employing a metal runner 234 that serpentines back and forth to assure the theoretical impedance of the metal, which is the impedance of the metal runner absent any stress migration voids, between any two taps is constant, particularly due to changing direction of the metal runner, the present invention may employ the direction change feature taught in U.S. Pat. No. 5,534,862, the disclosure of which is hereby incorporated by reference.

The stress migration test structures 10 and 210 may be fabricated in any level or levels of conductors of an integrated circuit. The taps, if not available directly, may be accessible from the top surface of a wafer or chip utilizing vias. Vias are vertical conduction paths that interconnect conductor levels, with bond pads capable of being engaged by a probe at the uppermost level. The taps 16 and $T_i$ of stress migration test structures 10 and 210, respectively, are capable of being accessed by test equipment during testing. During testing, probes contact taps 16 and $T_i$, and measure the impedance therebetween, or measure impedance between taps and compare the measured impedance to an expected impedance between the taps or a reference impedance.

A stress migration void test method includes several steps. In a preferred embodiment stress migration test method for wafer testing, probes contact adjacent taps and measure the impedance of resistor R14 of the metal runner 12 or 234 therebetween. To effectively detect stress migration voids, the impedance of the conduction path, metal runner 12 or 234, between adjacent taps must be small enough that the variation of impedance between taps due to a stress migration void of the magnitude desired to be detected, is a substantial or at least detectable portion of the impedance of the conduction path, or metal runner, between adjacent taps absent stress migration voids. Providing an impedance $R_i$ of appropriate impedance is achieved by placing taps 16 or $T_i$ sufficiently close together along the conduction path to result in the desired magnitude of impedance between taps.

One technique to accurately measure impedances of small magnitude that avoids errors due to probe contact resistance is a method known as Kelvin sensing. Kelvin sensing employs two sets of two probes, for a total of four probes. The stress migration test structure is a metal runner that consists of a series of resistors or impedance segments. Each segment extends from one tap to an adjacent tap. An impedance measurement of one segment is made using four taps and the three contiguous interdigitated segments of the metal runner between the four taps. The impedance of the center segment of the three contiguous segments is measured. The outer two probes engage the most distant two of the four taps, and establish a known current (I) between the outermost two of the four taps. The inner two taps, coupled across the segment of the conductive runner whose impedance is being determined, are employed to measure the resultant voltage (V) developed across the resistor or segment of stress migration test structure 10 between the two inner taps. The impedance of the resistor or segment of the metal runner between the two inner taps can then be determined through the application of Ohm's law, $Z=V/I$. The application of Ohm's law may be accomplished by the test equipment, and stored for future use. In this manner, the impedance of one resistor or segment of stress migration test structure 10 or 210 has been determined. The four probes are then shifted by one tap and the impedance of another resistor determined. Note that three of the four taps are the same taps used in determining the impedance of the previous resistor or segment of the stress migration test structure. This process continues to determine the impedance of the other resistors or segments. Other methods may also be used to determine the impedance of segments of the metal runner of stress migration test structure 10 or 210.

Using the Kelvin sensing measurement technique described above, starting at one end of the stress migration test structure and using four taps, apply a known current between the outer two of four probes and measure the developed voltage between the two inner probes, then compute and store for subsequent processing the impedance of the second segment of the stress migration test structure. Note when using the Kelvin method, the first segment is unavailable for measurement. If the taps, where the probes will contact, are arranged in a pattern, an automated probe positioning tool can be used to step through the taps to measure the impedance of the segments of the stress migration test structure 10 or 210. To step to a new group of taps, apply a current, measure the developed voltage, determining the impedance by application of Ohm's law, and store the impedance. This technique is repeated until the impedance of all but the last segment of the stress migration test structure have been recorded. The last segment of the stress migration test structure is also unavailable for Kelvin measurement. The impedance of each of the segments of the stress migration test structure except the two end segments are known. The impedance of the first and last segments of the stress migration test structure may be ignored in subsequent calculations.

Stress migration test structures 10 or 210 are comprised of many segments. In a viable process, the number of segments of the stress migration test structure that contain voids is expected to be a small percentage of the total number of segments of the stress migration test structure. Sheet resistance of metalization can vary over a large range, as much as plus or minus 50% from one processing run to the next, making advance determination of impedance for a given segment untrustworthy. Such variation compounds the difficulty to determine whether a segment under test contains stress migration voids. A more accurate approach is to take advantage of the statistical nature of variation in sheet resistance due to variations in processing, in that the relative impedance of segments of stress migration test structure that do not have stress migration voids typically will be within a small percentage, such as less than one percent, of each other, even in the presence of an unknown absolute sheet resistance value due to sheet resistance variations.

The average value of segment impedance is determined, such as by summing the impedance of the individual segments of the stress migration test structure and dividing by the number of segments whose impedance was determined. The determined impedance of all segments may be included in the average segment impedance since a determination of which segments contain stress migration voids and which segments do not contain stress migration voids has not yet been made. The average segment impedance is the nominal segment impedance, taking into account processing variations in conductor sheet resistance.

The impedance of a resistor segment having a stress migration void of a percent line width or cross section penetration that is the maximum allowable void size for a given line width technology can be calculated mathematically, or can be determined empirically. For example, to ascertain the impedance of a resistor having the maxim allowable stress migration void size, the impedance of a number of resistor segments having the maximum allowable stress migration void can be determined as indicated above, and averaged to improve the accuracy of the determined impedance, producing a threshold impedance. The threshold impedance represents the impedance at or above which a resistor or segment of a stress migration test structure is considered to contain a stress migration void. The impedance of a segment that has one or more stress migration voids is greater than the impedance of a segment that does not have a stress migration void.

While the determined impedance of each resistor or segment of the stress migration test structure could be compared to the threshold impedance to determine whether a stress migration void is present in a particular resistor or segment, the presence of a stress migration void using this comparison may be unobservable in the noise. It is desirable to make the impedance of a resistor or segment of the stress migration test structure having a stress migration void stand out of the noise and be larger than the random variation of resistor or segment impedance due to fabrication processes, including uniformity of metal deposition. A technique to make the presence of a stress migration void observable above the noise divides the determined impedance of each resistor or segment by the nominal segment impedance in a normalization process, producing a corresponding impedance ratio for each resistor or segment of stress migration test structure 10 or 210. Calculation of an impedance ratio may or may not explicitly produce the intermediate terms described herein.

An impedance ratio threshold is generated by dividing the threshold impedance by the nominal segment impedance. The impedance ratio threshold so calculated may be adjusted to detect stress migration voids of a percent line width or cross section penetration desired.

Segments of stress migration test structure 10 or 210 that do not have stress migration voids will have an impedance ratio of approximately one. The impedance ratio of each resistor or segment of stress migration test structure 10 or 210 is compared to the impedance ratio threshold. If the impedance ratio associated with a resistor or segment of stress migration test structure 10 or 210 is less than the impedance ratio threshold, a decision is made that a stress migration void does not exist in the corresponding resistor or segment of the stress migration test structure 10 or 210.

Segments of stress migration test structure 10 or 210 that have stress migration voids will have an impedance ratio of greater than one. If in the comparison of the impedance ratio of each resistor or segment of stress migration test structure 10 or 210 to the impedance ratio threshold, the impedance ratio associated with a resistor or segment of stress migration test structure 10 or 210 equals or exceeds the impedance ratio threshold, a decision is made that a stress migration void exists in the corresponding resistor or segment of the stress migration test structure 10 or 210. In this manner, a determination is made whether each resistor or segment of the stress migration test structure 10 or 210 contains or does not contain a stress migration void.

Because each impedance ratio is associated with a resistor or segment of stress migration test structure 10 or 210, when an impedance ratio equals or exceeds the impedance ratio threshold, thereby indicating that the associated resistor or segment of stress migration test structure 10 or 210 contains a stress migration void, the resistor or segment that contains a stress migration void can be identified, located within the stress migration test structure, and observed using an electron microscope or other tools to diagnose a cause of the stress migration void.

Stress migration test structure 10 or 210 can be used to determine the difference between intermetallic reactions, which are higher-resistance compounds formed between materials in the individual films, and stress migration void growth. Intermetallic reactions will grow uniformly at the interface between layers in a multi-layer metal conductor. In other words, resistance differential between the original metal layers and the layer formed by their reaction will be the same for each segment. Conversely, the differential resistance between the original metal layers and any reaction-product layer will be substantially greater for segments containing stress migration voids. If stress migration void test result data, that is impedance per resistor or segment, is retained according to spatial statistics (which means tracking impedance values for individual resistors or segments, together with the physical distance between deviatory resistors or segments), analysis of stress migration void test result data can also yield a measure of both the size and density of stress migration voids. If the stress migration void test procedure is repeated at different times, the resulting stress migration void data can determine whether stress migration has saturated, or whether stress migration will get worse with the passage of additional time.

The material of the conduction path in the stress migration test structure is assumed to be typical of the material of conduction paths throughout a wafer, albeit there may be several stress migration test structures located at various locations throughout the wafer. Finding several stress migration voids in one conduction path, such as runner 12 or 234, or several stress migration voids on a wafer, can be used as feedback information to change process parameters to improve the manufacturing process such that fewer stress migration voids are present in wafers, or regions of wafers, that are processed subsequent to changing the process parameters. Finding more than an acceptable number of stress migration voids on one or more wafers might suggest that an individual chip should not be packaged as an integrated circuit. Also, finding more than an acceptable number of stress migration voids on one or more wafers might suggest that a batch of wafers should be scrapped rather than further value added to dice the wafers and package the chips into integrated circuits.

Figure 3:
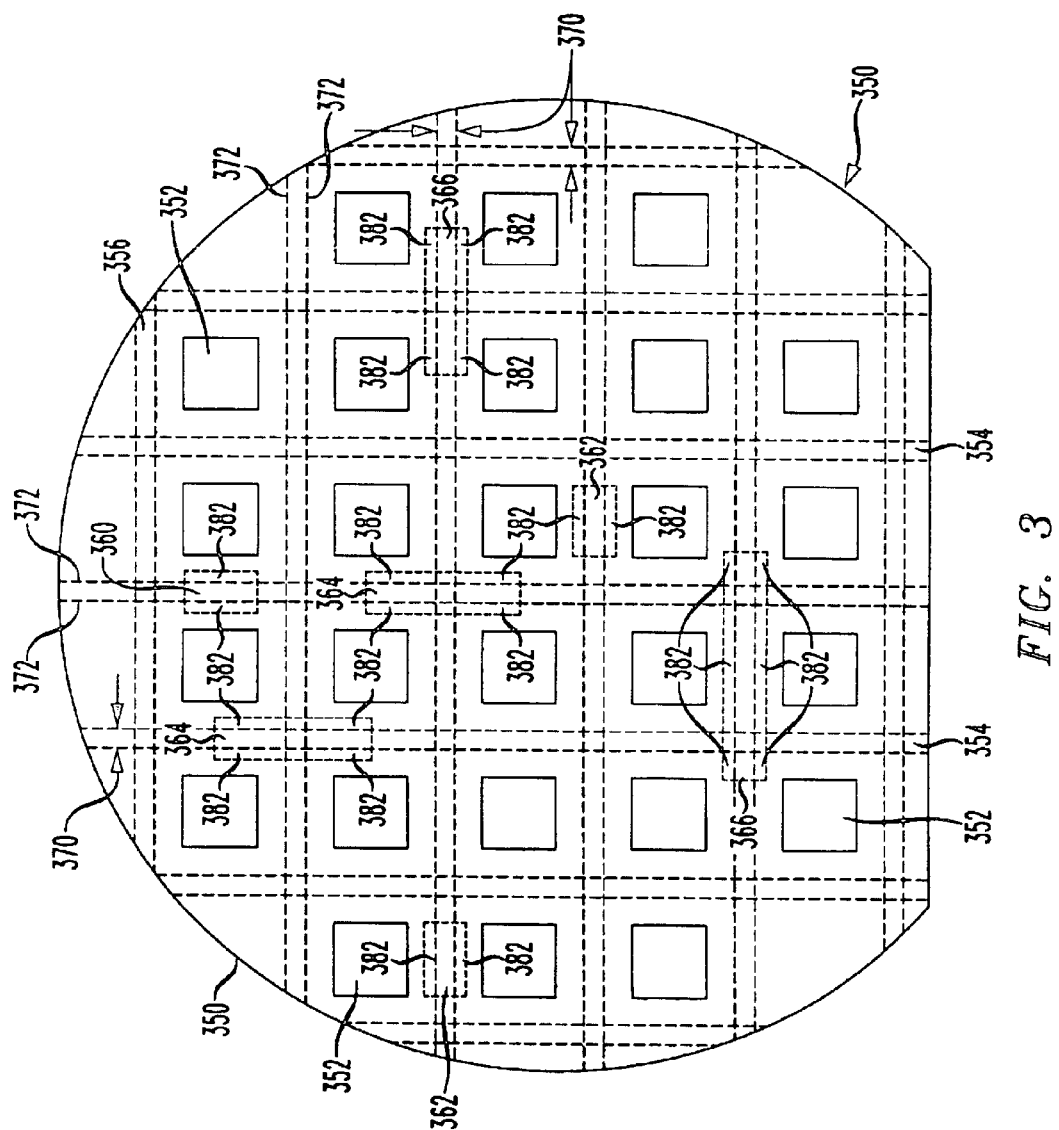
FIG. 3 is a wafer having a plurality of dies arranged thereon, with locations therebetween and thereamong for stress migration test structures at various locations throughout the wafer.

Referring to FIG. 3, a wafer 350 is illustrated having a plurality of dies 352 formed in a relatively uniform pattern thereon. Adjacent dies 352 are separated by intersecting transverse streets, here represented as vertical streets 354 and horizontal streets 356. What is considered a horizontal or vertical street is relative to orientation of wafer 350 for the purpose of distinguishing one from the other. Streets 354 and 356 may or may not be of the same width and distance apart. In current line width technologies, the streets are approximately 80 microns wide. Stress migration test structures 10 and 210 may be located throughout wafer 350 in streets 354 and 356, such as between and among dies 352. Note that other test structures including but not limited to the electromigration monitor disclosed in U.S. Pat. No. 5,264,377, and the line width control feature disclosed in U.S. Pat. No. 5,780,316, the disclosures of which are hereby incorporated by reference, may also be located in streets 354 and 356 throughout wafer 350.

Locations for stress migration test structures, indicated as broken-line boxes in the streets, are located throughout wafer 350. Locations 360 are between adjacent dies 352 in a vertical street 354. Locations 362 are between adjacent dies 352 in a horizontal street 356. Locations 364 are among four dies 352 in both vertical street 354 and horizontal street 356, predominantly in a vertical street 354. Locations 366 are among four dies 352 in both vertical street 354 and horizontal street 356, predominantly in a horizontal street 356.

Wafers 350 are cut within streets 354 and 356 with a saw, as is known in the art, to separate the individual dies. Being sawn or cut to form the individual dies 352 is referred to as being diced. When separated, the individual dies are typically referred to as a chip 358. A chip 358 includes a circuit layout area and bond pads of a die 352, and additionally a portion of the substrate forming streets 354 and 356, along edges of the die, not cut away by the dicing process. The saw blade used to cut a wafer into dies has a kerf 370 that does not cut into dies 352. Broken lines 372 in the streets 354 and 356 illustrate the saw kerf 370, the width of the saw cut due to the saw blade having a finite width. The saw kerf 370, which has a finite width that is narrower than streets 354 and 356, does not remove all of streets 354 and 356, and therefore does not necessarily remove all of a stress migration test structure located in streets 354 or 356. Thus, a subset of chips 358, designated chips 380, will have a portion 382 of a stress migration test structure 10 or 210 along one or more edges, even after the chip 380 is packaged as an integrated circuit. How much of a stress migration test structure 10 or 210 remains as portion 382 on a chip depends on several factors including but not limited to the width of a street 354 or 356, the width of saw kerf 370, the dimensions (length and width) of the stress migration test structure, and the position of a stress migration test structure (for example, location 360 or 362 versus location 364 or 366), or the position of a stress migration test structure relative to where the saw kerf is cut in a street.

Stress migration test structures 10 and 210 need not only be placed in streets as discussed above. Stress migration test structures may be placed in regions that are otherwise unused die or chip areas as discussed with respect to FIG. 4, or may be included as part of a circuit on an integrated circuit as discussed below with respect to FIGS. 5, 6 and 7.

Figure 4:
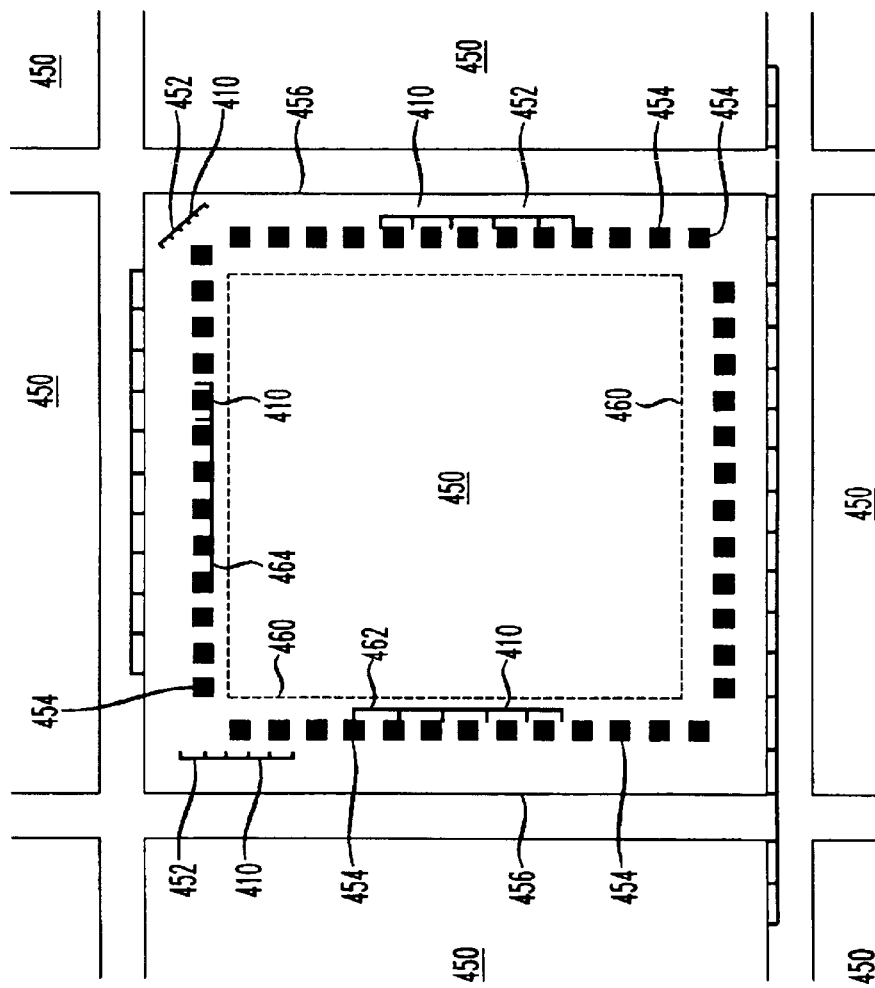
FIG. 4 is a die with bonds pads around the periphery having locations proximate the bond pads for stress migration test structures.

Referring to FIG. 4, stress migration test structures 410, may be placed on a die 448 or chip 450 in an otherwise unused area. In FIG. 4, several otherwise unused areas of die 448 or chip 450 are illustrated. Bond pads 454 are located proximate the periphery of a die 448 to accommodate wire bonding between a bond pad and a respective lead of a lead frame. However, some space exists both between the bond pads 454 and the periphery 456 of chip 450, and between the bond pads 454 and the periphery 460 of the standard area for circuit layout on a die 448. As illustrated by locations 452, a stress migration test structure may be located between bond pads 454 and the periphery 456 of a chip 450. Stress migration test structures 410 may also be placed in locations 462 between the periphery 460 of the standard area for circuit layout on a die or chip and bond pads 454. Additionally, stress migration test structures 410 may be placed in locations 464 on a lower-level metal, directly beneath bond pads 454. Locations 452, 462, and 464 are indicated on FIG. 4 as representing potential sites for a stress migration test structure 410.

Since stress migration voids enlarge with the passage of time and may be affected by different assembly processes, it is desirable to have the capability to evaluate stress migration voids not just at the completion of manufacture of die 448 on wafers, but also after a chip 450 has been packaged as an integrated circuit. Some integrated circuits are stored for long time periods after fabrication, while other integrated circuits are incorporated into products that may be stored a long time period before being placed into service. Furthermore, integrated circuits may be placed in an application that has a long life.

Figure 5:
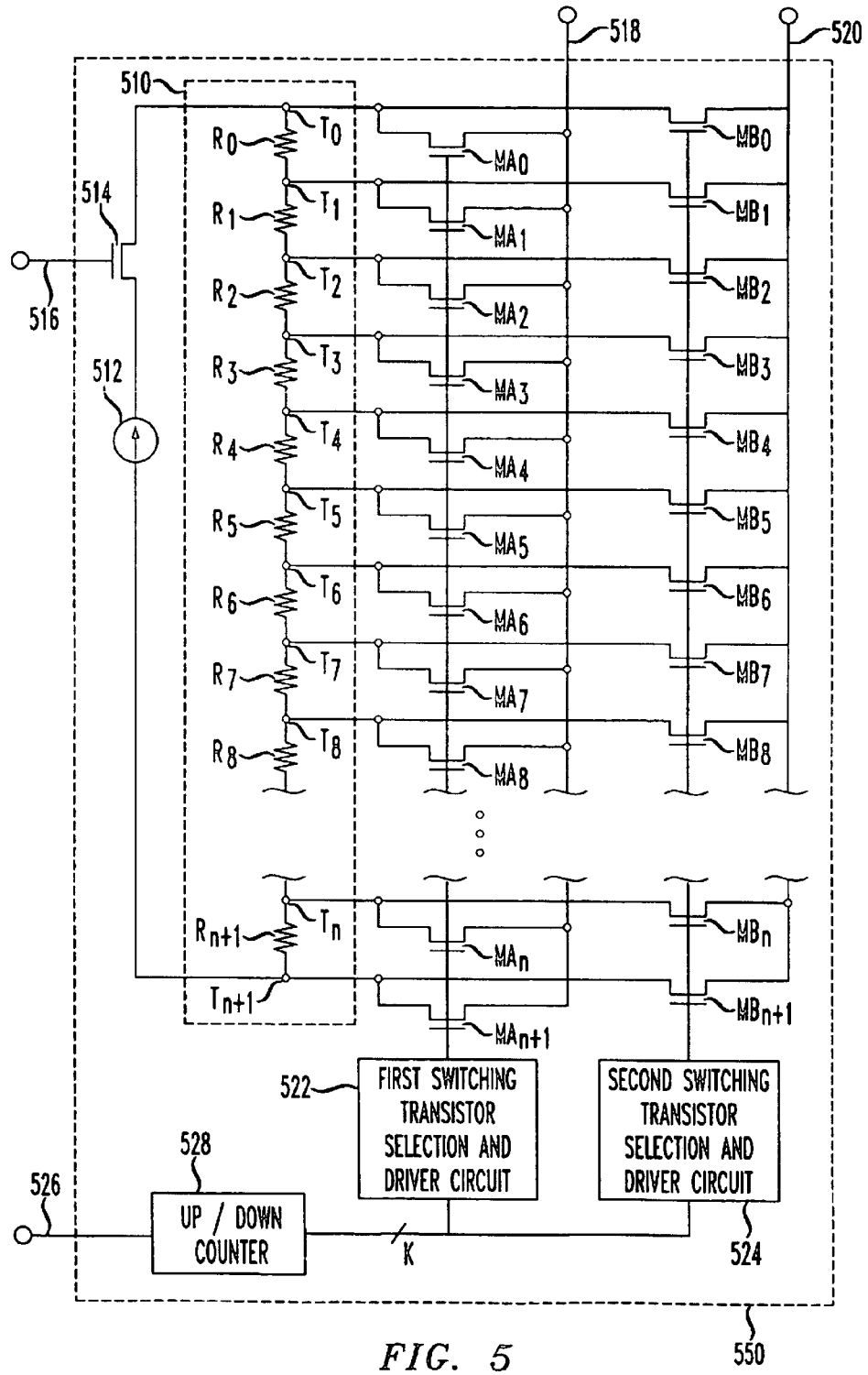
FIG. 5 is a stress migration test structure with additional circuitry capable of automated electrical stepping for use in an integrated circuit.

FIG. 5 illustrates, in schematic diagram form, a stress migration test structure 10 or 210 implemented with additional circuitry for electrically controlled selection of the resistor or segment of a stress migration test structure 510 under test, suitable for incorporation in an integrated circuit. In FIG. 5, the stress migration test structure 510 is substantially the same as stress migration test structure 10, 210 or 410. Stress migration circuitry 550 includes a stress migration test structure 510 having taps $T_0$ through $T_{n+1}$ at equal impedance intervals of stress migration test structure 510. As in stress migration test structures 10, 210, or 410, the impedance intervals need not be equal, but equal impedance intervals and hence equal impedances simplify the analysis as well as detection of stress migration voids. A power source 512, which may be a voltage or current source, such as a constant current source or voltage source with supply current measuring capability, is coupled across the stress migration test structure 510. Power source 512 provides a known or measurable current (I) to stress migration test structure 510. For single ended operation, $T_{n+1}$ may be ground potential. A switching transistor 514 has its source-drain path coupled to conduct current from power source 512 to the stress migration test structure 510. The gate 516 of transistor 514 may be used to switch the state of transistor 514 between an off state and an on state. Transistor 514 may be employed as an on-off switch to control power to stress migration test structure 510, allowing stress migration test structure 510 to consume power when the stress migration test structure 510 is being used. The control and measurement signals applied to nodes 516, 518, 520, and 526 may be coupled to dedicated bond pads on the die or may be coupled to bond pads on the die that are shared, such as through a multiplexer. These signals may or may not be accessible outside the integrated circuit once the die is encapsulated in a package as an integrated circuit.

Switches $MA_0$ through $MA_{n+1}$ are each coupled between a corresponding one of intermediate taps $T_o$ through $T_{n+1}$, and output node 518. Switches $MB_0$ through $MB_{n+1}$ are each coupled between a corresponding one of intermediate taps $T_o$ through $T_{n+1}$ and output node 520. Nodes 518 and 520 provide access to the voltage (V) developed across segment $R_i$ of stress migration test structure 510 by energy source 512 of known or measured current (I). As in the testing technique for wafers described above, the resistor or segment impedance is calculated by Ohm's law Z=V/I. Alternatively, the voltage developed across a segment, $R_i$, could be determined as the difference between the voltage developed at node 518 as referenced to a reference potential, such as at node $T_{n+1}$, and the voltage developed at node 520 as referenced to the same reference potential, or as referenced to another reference potential if the difference between the two reference potentials is known or can be determined. In the illustrative embodiment, the switches are metal oxide semiconductor (MOS) transistors. Switches $MA_0$ through $MA_{n+1}$ are controlled by first switching transistor selection and driver circuit 522. Switches $MB_0$ through $MB_{n+1}$ are controlled by second switching transistor selection and driver circuit 524. Since a binary input of K bits to the transistor selection and driver circuit can be converted into the drives for all n+2 transistors driven by each circuit, K bits are provided to each circuit 522 and 524.

Advantage may be taken of the pre-existing knowledge that adjacent taps will be coupled to respective output nodes 518 and 520. Thus, the same K bits may be provided on lines 526 as inputs to both first switching transistor selection and driver circuit 522 and second switching transistor selection and driver circuit 524. One of the circuits will shift by one tap, the tap that couples to its respective output node 518 or 520. For example, circuit 522 may add one to the tap identified by the k-bit input 526, or circuit 524 may subtract one from the tap identified by the k-bit input at node 526. One skilled in the art could design a counter to sequence through the binary inputs to node 526 necessary to test the impedance or resistance of each segment of stress migration test structure 510, and hence stress migration voids, between adjacent pairs of taps in a metal runner of stress migration test structure 510. Of course, the range of binary inputs at node 526 would be adjusted correspondingly depending on the number of segments in stress migration test structure 510 and also the number of taps, $T_i$. The processing steps within circuitry 550 to determine the segments of stress migration test structure 510 that have a stress migration void closely follow the steps described above for stress migration test structures 10 and 210 with the exception of the mechanical stepping of the probes, since in circuitry 550 stepping from one set of taps to determine the impedance of a segment of stress migration test structure to another set of taps to determine the impedance of another segment of stress migration test structure is implemented electronically using counters and switches.

Of course, the impedance or resistance between any two taps $T_o$ through $T_{n+1}$ could be determined by providing independent inputs to first switching transistor selection and driver circuit 522 and second switching transistor selection and driver circuit 524 and observing the corresponding voltage developed across output nodes 518 and 520. Processing steps could be taken as described above with respect to the test procedure for stress migration test structures 10 and 210.

Figure 6:
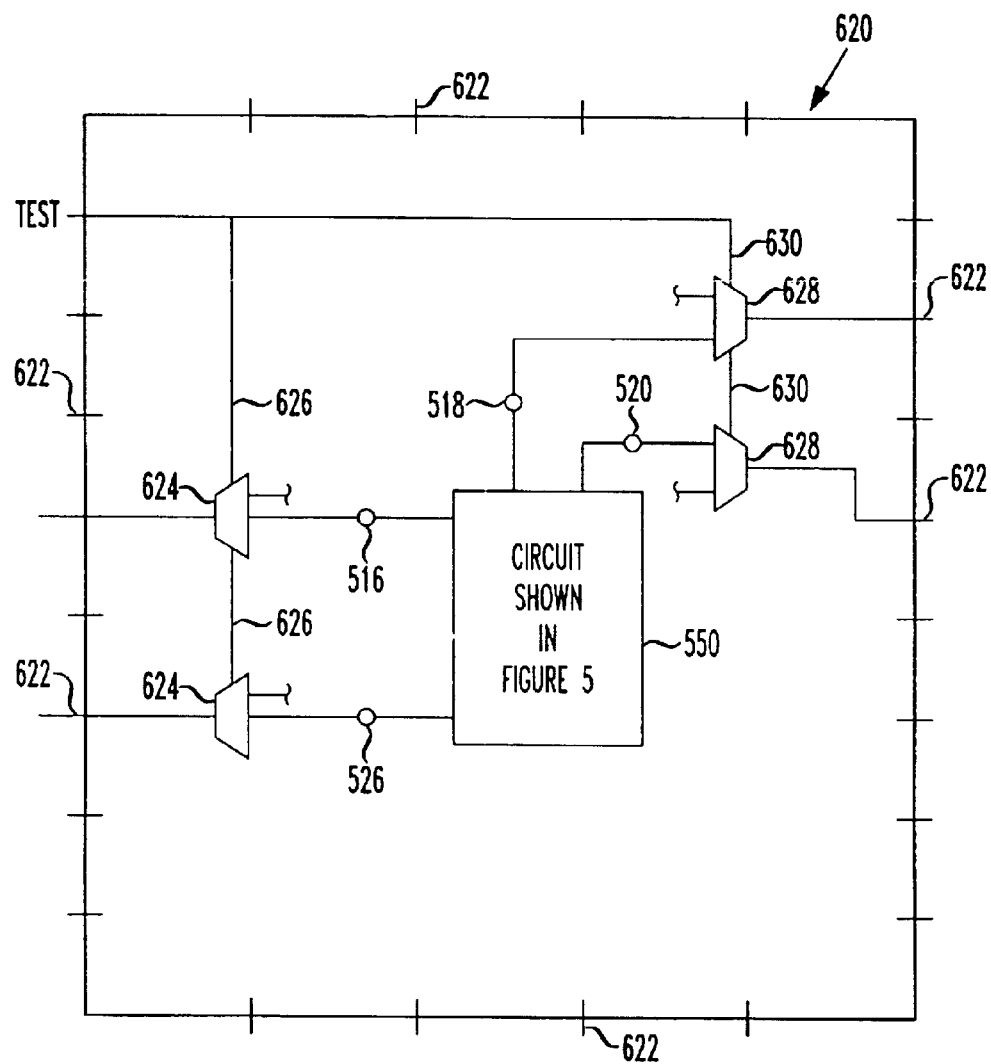
FIG. 6 is the stress migration test structure and circuitry of FIG. 5 configured as part of an integrated circuit where access to the stress migration test structure interface leads is multiplexed or otherwise shared with other inputs or outputs of the integrated circuit.

FIG. 6 illustrates stress migration circuitry 550 which incorporates stress migration test structure 510 as well as additional circuitry for multiplexing or otherwise sharing the control and measurement nodes 516, 518, 520, and 526 with other input or output leads of an integrated circuit 620. The embodiment of the invention illustrated in FIG. 6 includes the advantage of providing conditional access to the stress migration test structure while it is encapsulated in a package, thus providing for the detection of stress migration voids subsequent to the manufacture of an integrated circuit 620. Detection of stress migration voids, therefore, can be detected while integrated circuit 620 is in a simulated accelerated aging environment or while integrated circuit 620 is in the actual environmental conditions under which integrated circuits are used.

Integrated circuit 620 has a plurality of leads 622 proximate the periphery that may be inputs to integrated circuit 620 or outputs from integrated circuit 620, or both. Leads 622 may be dedicated to a single function or may be shared between or among more than one function. Integrated circuit 620 includes stress migration circuitry 550 receiving inputs from leads 622. Inputs to stress migration circuitry 550 are received on leads 622 and pass through respective multiplexers 624. A select input 626 to multiplexers driven by a signal from a TEST lead 622 determines whether the inputs are directed to stress migration circuitry 550 or to other circuits (not shown). Similarly, outputs from stress migration circuitry 550 are provided as inputs to multiplexers 628. By sharing leads between the stress migration circuitry 550, which may be operated in a test mode, and other circuitry in a non-test mode, the number of leads required for the integrated circuit does not increase. However, a small amount of additional on-chip circuitry is required to perform the switching function between inputs and outputs available during test mode operation, and the inputs and outputs available during operation other than in the test mode operation. The additional on-chip circuitry to perform the switching function may be located on a different level from the stress migration circuitry 550. Evaluation of stress migration test structure 510 using stress migration circuitry 550 begins with the multiplex "TEST" signals 626 and 630 being set to enable access to nodes 516, 618, 520 and 526. Thereafter the evaluation follows the procedure described above for the stress migration test structure of FIG. 5. A select input 630 to multiplexers 628 driven by a signal from a TEST lead 622 determines whether the outputs provided to output leads 622 are from stress migration circuitry 550 or from other inputs to multiplexers 628.

Dedicated leads as inputs and outputs from stress migration circuitry 550 could be provided by eliminating multiplexers 624 and 628 and providing dedicated input leads coupled to input nodes of stress migration circuitry 550 as well as dedicated output leads coupled to output nodes of stress migration circuitry 550. Providing dedicated input and output leads to stress migration circuitry 550 would increase the number of input and output pins or leads necessary for an integrated circuit.

Figure 7:
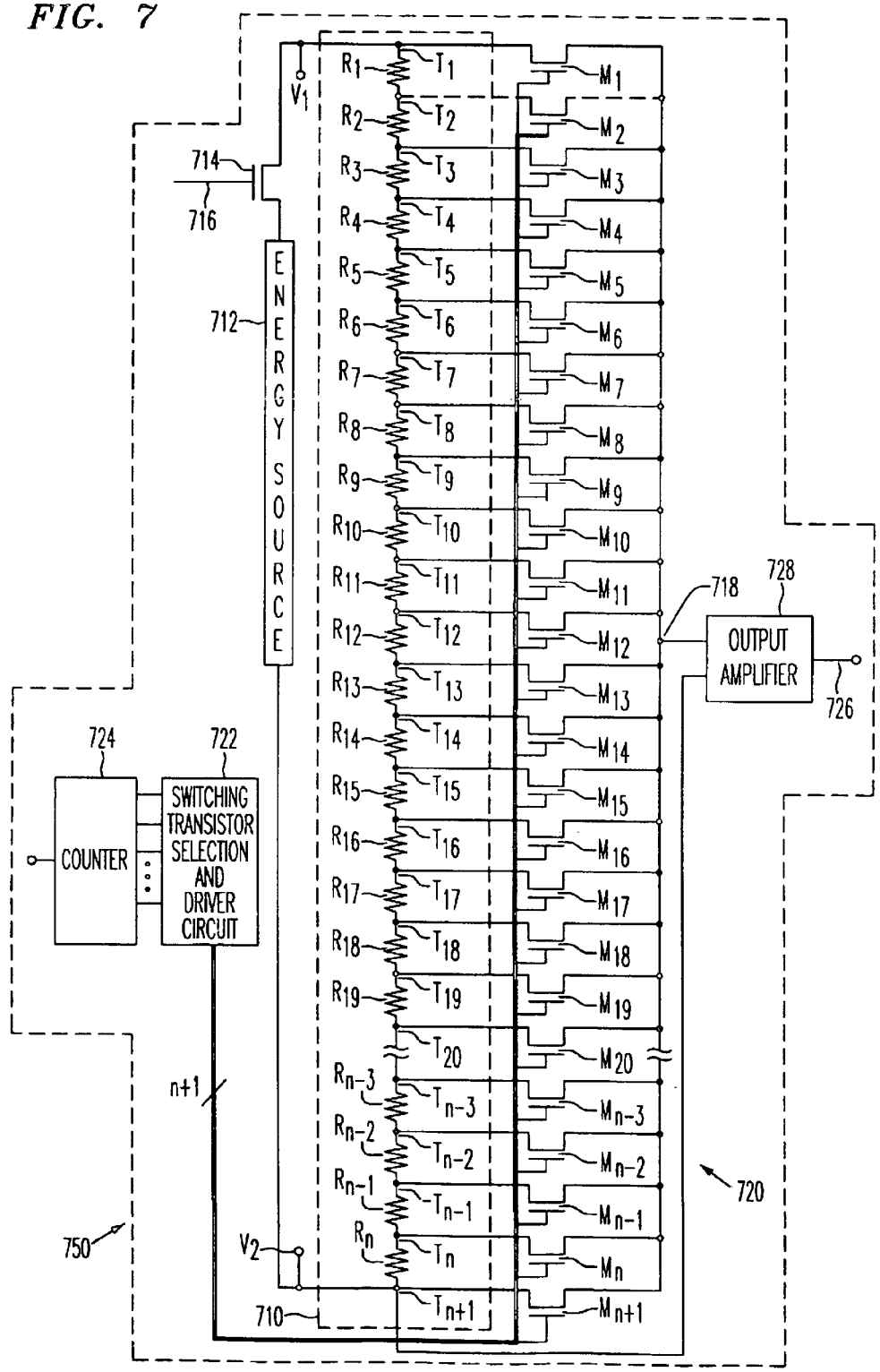
FIG. 7 is an alternate embodiment stress migration test structure and circuitry.

FIG. 7 illustrates alternate embodiment stress migration circuitry 720 for applying a stress migration test structure 710 as a circuit on an integrated circuit 750 in which there is only one tap voltage available at a time, and the tap voltage is buffered while being referenced to the last tap, $T_{n+1}$. Stress migration circuitry 720 includes a stress migration test structure 710 having taps $T_0$ through $T_{n+1}$ at equal impedance intervals of stress migration test structure 710. As stated above, the impedance intervals need not be uniform. A power source 712, which may be a voltage or current source, such as a constant current source, is coupled across the stress migration test structure 710. For single ended operation, $T_{n+1}$ may be ground potential. A switching transistor 714 has its source-drain path coupled to conduct current from power source 712 to the stress migration test structure. The gate 716 of transistor 714 provides a node that may be used to switch the state of transistor 714 between an off state and an on state. Transistor 714 may be employed as an on-off switch to control power to stress migration test structure 710.

Switches $M_0$ through $M_{n+1}$ are each coupled between a corresponding one of intermediate taps $T_o$ through $T_{n+1}$, and output node 718. In the illustrative embodiment, the switches are metal oxide semiconductor (MOS) transistors. Switches $M_0$ through $M_{n+1}$ are controlled by switching transistor selection and driver circuit 722. Since a binary input of K bits to the transistor selection and driver circuit can be converted into the drives for all n+1 transistors driven by circuit 722, a K bit counter 724 is provided to count through each of the possible bit combinations either automatically or one step at a time. The counter input and output amplifier output could be coupled to pins on an integrated circuit, directly to dedicated pins or multiplexed to shared pins, as described above, to provide the output.

The voltage between a given tap, for example tap $T_L$, identified by counter 724 and a reference point, such as tap $T_{n+1}$, is provided at output 726 of output amplifier 728 and retained. The counter increments or decrements to the next count which provides the voltage at an adjacent tap, $T_{L+1}$ or $T_{L-1}$ depending on how the counter is implemented. For this example, assume the counter increments such that output 726 steps from a tap of a smaller reference numeral to a tap of a larger reference numeral. Thus, after tap $T_L$, tap $T_{L+1}$ is coupled to output 726. The voltage developed at tap $T_{L+1}$ is measured at output 726 and recorded. Each of the voltages at taps $T_L$ and $T_{L+1}$ are measured relative to the tap $T_{n+1}$, which may be ground. Knowing the current passing through all of the series impedances $R_1$ through $R_n$ and the voltages at taps $T_L$ and $T_{L+1}$, the impedance between taps $T_L$ and $T_{L+1}$ can be calculated and compared to a threshold or known theoretical expected impedance, with tolerance, to determine whether a stress migration void exists between taps $T_L$ and $T_{L+1}$. Repeating this process for all adjacent pairs of taps in stress migration test structure 710 results in the entire stress migration test structure providing information regarding the presence or absence of stress migration voids. This alternate embodiment circuitry 720 may evaluate the presence or absence of stress migration voids either at wafer probe or after a die is packaged as an integrated circuit.

Switches $M_1$ through $M_{n+1}$ are coupled between corresponding intermediate taps $T_1$ through $T_{n+1}$ and output node 718. Switching transistors $M_1$ through $M_{n+1}$ are controlled by switching transistor selection and driver circuit 722 as is known in the art. Transient capacitor-charging currents due to transistor $M_1$ through $M_{n+1}$ being switched are allowed to go to zero or the circuit is allowed to settle.

Figure 8:
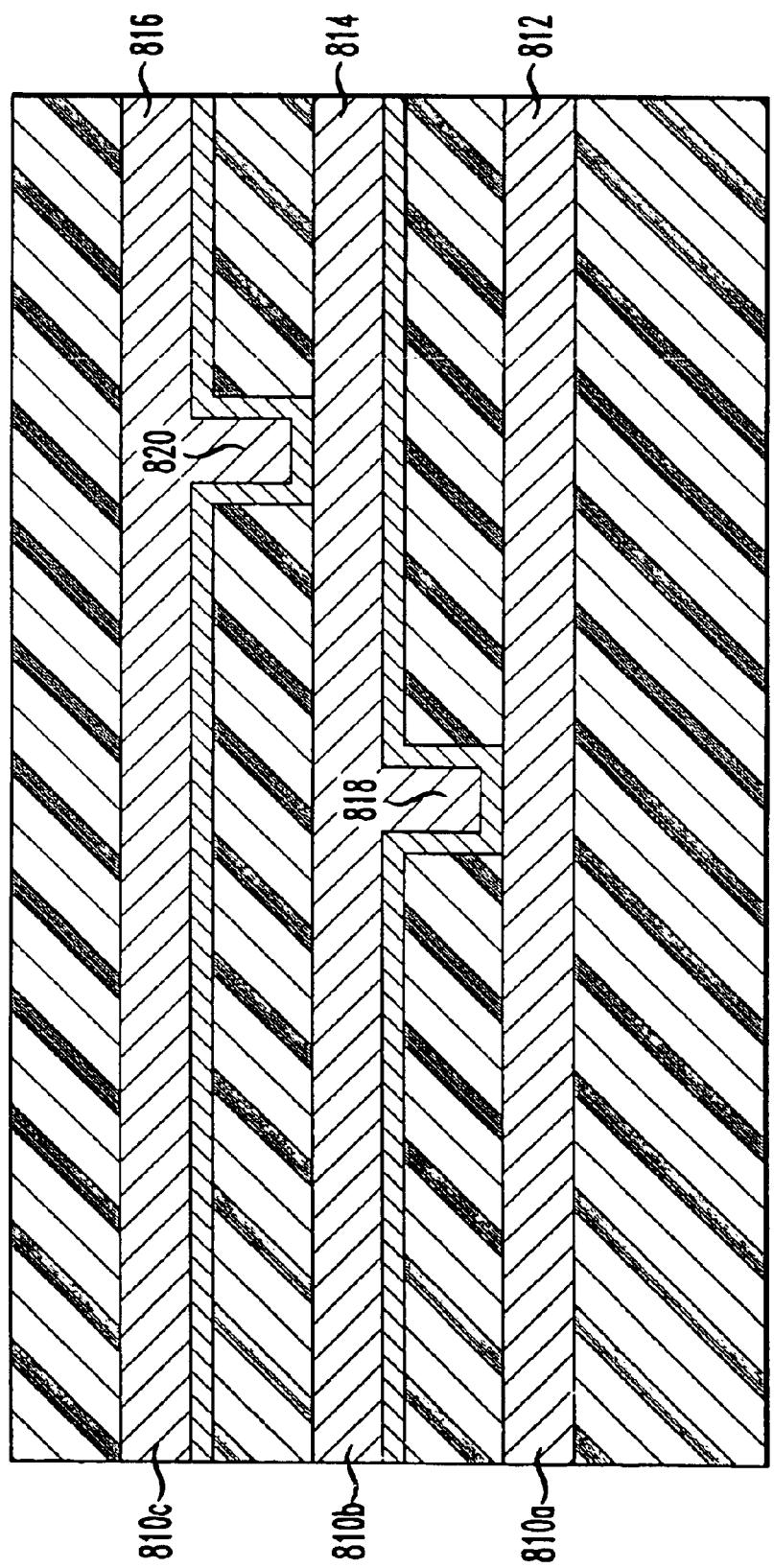
FIG. 8 illustrates a portion of a stress migration test structure on multiple metal layers in an integrated circuit.
Figure 9:
FIG. 9 is a scanning electron microscope photograph (photomicrograph) of a stress migration void in an aluminum alloy conductor.
Figure 10:
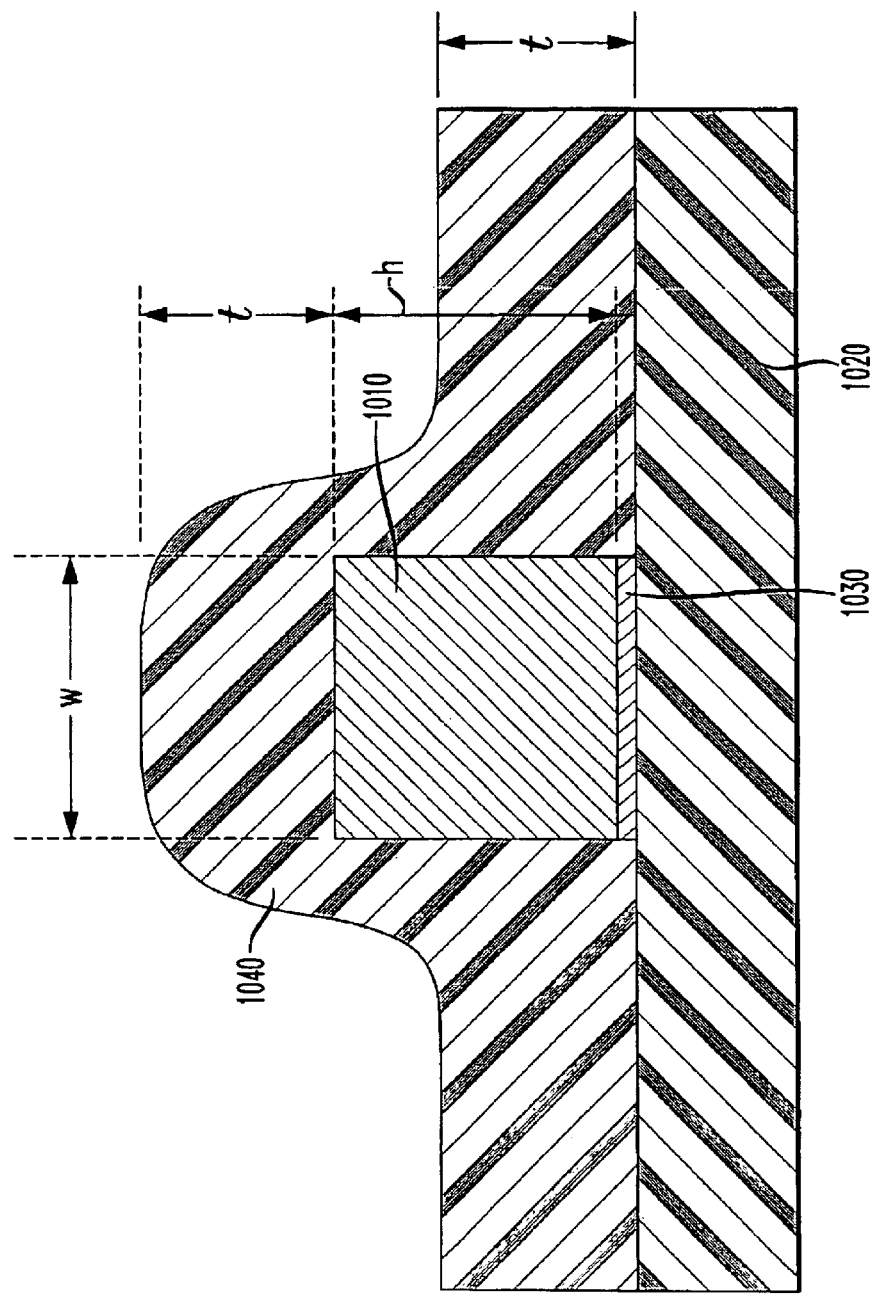
FIG. 10 illustrates a cross-section of an aluminum alloy conductor on a wafer, coated by a layer of dielectric material.

While the resistor string of a stress migration test structure 10 of FIG. 1 is illustrated as being fabricated in a single layer of conductive conductor, the invention is not limited thereto. The resistor string may be fabricated in more than one level of conductive conductor with the portion of the resistor string fabricated in each layer of conductive conductor being able to detect stress migration voids in the respective layer of conductive conductor in which it is fabricated. The portions of the resistor string fabricated in various layers of conductive conductor are interconnected by vias, such as illustrated in FIG. 8. In FIG. 8, a first portion 810*a* of a resistor string 808 of a stress migration test structure 810 is fabricated in metal layer 812, a second portion 810*b* of stress migration test structure 810 is fabricated in metal layer 814 and a third portion 810*c* of stress migration test structure 810 is fabricated in metal layer 816. Metal layers 812 and 814 are interconnected by via 818. Metal layers 814 and 816 are interconnected by via 820. Other layer interconnection techniques may also be utilized. A stress migration test structure having a resistor string, fabricated of a doped polysilicon or other conductive material, on more than one level of conductive interconnects can have the various levels interconnected in a similar manner, as is known in the art.

While the illustrative embodiment of the invention has been described in the context of a silicon wafer and a dielectric of silicon dioxide, the invention is not limited thereto. The invention may be used in any wafer processing technology including but not limited to silicon, gallium arsenide, indium phosphate, and silicon germanium and with any conductive material for the runner including but not limited to such materials as aluminum, aluminum alloy, gold, refractory metal, copper, copper alloy, gold, gold alloy, silver, silver alloy, tungsten, doped polysilicon or layered combination of materials such as layers of metals or doped polysilicon covered by metals. Blanket layers may be deposited and subsequently patterned in the shape desired.

The invention provides a uniquely non-destructive test structure specific to stress migration voids. The invention provides an improvement in speed of test and enhanced reliability for integrated circuits by providing for the automated detection of stress migration voids in a conductor. Furthermore, the invention identifies the segment of the stress migration test structure, and hence the location of the stress migration void, for further evaluation or inspection. The invention also enhances integrated circuit reliability by providing access to the stress migration test structure after the chip has been encapsulated in a package as an integrated circuit, permitting detection of stress migration voids while integrated circuits are in a simulated accelerated aging environment or while integrated circuits are in the actual environmental conditions under which integrated circuits are stored and used.

What is claimed is:

1. A wafer, comprising:
   at least two die areas formed on the wafer, the at least two die areas defining a street therebetween; and
   a stress migration test structure in the street, the stress migration test structure comprising a conductive runner having a length sufficient to develop axial stress above the threshold for nucleating voids for the technology in which the runner is fabricated, the conductive runner having a plurality of taps at uniform impedance intervals along the runner, the taps spaced along the runner such that the variation of the impedance of the runner between adjacent taps, due to the presence of a stress migration void in the runner is a detectable portion of the impedance between the adjacent taps absent stress migration voids.

2. A wafer, comprising:
   at least four die areas formed on the wafer, the at least four die areas defining two intersecting streets thereamong; and
   a stress migration test structure in a region of the two intersecting streets proximate the at least four die areas and comprising a conductive runner having a length sufficient to develop axial stress above the threshold for nucleating voids for the technology in which the runner is fabricated, the conductive runner having a plurality of taps at uniform impedance intervals along the runner, the taps spaced along the runner such that the variation of the impedance of the runner between adjacent taps, due to the presence of a stress migration void in the runner is a detectable portion of the impedance between the adjacent taps absent stress migration voids.

3. A stress migration test device, comprising:
   a conductive runner, the conductive runner having a length sufficient to develop axial stress above the threshold for nucleating voids for the technology in which the runner is fabricated, the conductive runner having a plurality of taps at uniform impedance intervals along the runner, the taps spaced along the runner such that the variation of impedance of the runner between adjacent taps due to presence of a stress migration void in the runner is a detectable portion of the impedance between the adjacent taps absent stress migration voids.

4. A stress migration test device as recited in claim 3, wherein the conductive runner defines a width that is the minimum line width for the technology in which the runner is fabricated.

5. A stress migration test device as recited in claim 3, wherein the conductive runner defines a length that is at least 100 micrometers long.

6. A stress migration test device as recited in claim 3, wherein the conductive runner defines a length that is at least 400 micrometers long.

7. A stress migration test device as recited in claim 3, wherein the distance between adjacent ones of the plurality of taps encompasses at least ten crystallographic grains of the material of which the conductive runner is fabricated.

8. A stress migration test device as recited in claim 3, wherein tap conductors extending from the conductive runner to taps are of the same linewidth as the conductive runner.

9. A stress migration test device as recited in claim 3, wherein the conductive runner is comprised of two conductive materials providing parallel conduction paths of different impedances.

10. A stress migration test device as recited in claim 3, wherein the conductive runner extends unidirectionally.

11. A stress migration test device as recited in claim 3, wherein the conductive runner serpentines back and forth boustrophedonically.

12. A stress migration test device as recited in claim 3, wherein the conductive runner is fabricated on at least two levels of interconnects.

13. A chip, comprising:
a substrate having circuits within an area for circuit layout;
bond pads on the substrate along at least one edge of the chip, the bond pads being between the area for circuit layout and the at least one edge of the chip; and
a stress migration test device fabricated as part of the chip, the stress migration test device comprising a conductive runner, the conductive runner having a length sufficient to develop axial stress above the threshold for nucleating voids for the technology in which the runner is fabricated, the conductive runner having a plurality of taps at uniform impedance intervals along the runner, the taps spaced along the runner such that the variation of impedance of the runner between adjacent taps due to presence of a stress migration void in the conductive runner is a detectable portion of the impedance between the adjacent taps absent stress migration voids.

14. A chip as recited in claim 13, wherein the stress migration test device is fabricated in a layer beneath the layer in which the bond pads are fabricated.

15. A chip as recited in claim 14, packaged as an integrated circuit.

16. A chip as recited in claim 13, wherein the stress migration test device is fabricated between the bond pads and the at least one edge of the chip.

17. A chip as recited in claim 16, packaged as an integrated circuit.

18. A chip as recited in claim 13, wherein the stress migration test device is fabricated between the bond pads and the area for circuit layout.

19. A chip as recited in claim 18, packaged as an integrated circuit.

20. A chip as recited in claim 13, wherein the stress migration test device is fabricated within the area for circuit layout.

21. A chip as recited in claim 20, packaged as an integrated circuit.

22. A chip, comprising:
a substrate having circuits within an area for circuit layout;
bond pads on the substrate along at least one edge of the chip, the bond pads being between the area for circuit layout and the edge of the chip; and
at least a portion of a stress migration test device fabricated between the bond pads and the at least one edge of the chip, the stress migration test device comprising a conductive runner, the conductive runner having a length sufficient to develop axial stress above the threshold for nucleating voids for the technology in which the runner is fabricated, the conductive runner having a plurality of taps at uniform impedance intervals along the runner, the taps spaced along the runner such that the variation of impedance of the runner between adjacent taps due to presence of a stress migration void in the conductive runner is a detectable portion of the impedance between the adjacent taps absent stress migration voids.

23. A chip as recited in claim 22, wherein the conductive runner extends unidirectionally.

24. A chip as recited in claim 22, wherein the conductive runner serpentines back and forth boustrophedonically.

25. A chip as recited in claim 22, wherein at least a portion of a stress migration test device is fabricated between the bond pads and more than one edge of the chip.

26. A chip as recited in claim 22, packaged as an integrated circuit.

27. A chip as recited in claim 22, wherein the conductive runner of the at least a portion of a stress migration test device is fabricated in more than one level of metal.

28. A chip as recited in claim 22, wherein the conductive runner of the at least a portion of a stress migration test device is comprised of two conductive materials providing parallel conduction paths of different impedances.

29. A stress migration test device, comprising:
a conductive runner, the conductive runner having a length sufficient to develop axial stress above the threshold for nucleating voids for the technology in which the runner is fabricated, the conductive runner having a plurality of taps at impedance intervals along the runner, the taps spaced along the runner such that the variation of impedance of the runner between adjacent taps due to presence of a stress migration void in the runner is a detectable portion of the expected impedance between the adjacent taps absent stress migration voids.

30. A stress migration test device as recited in claim 29, wherein the conductive runner is comprised of two conductive materials providing parallel conduction paths of different impedances.

31. A stress migration test device as recited in claim 29, wherein the conductive runner is fabricated on at least two levels of interconnects.

32. A chip, comprising:
a substrate having circuits within an area for circuit layout;

bond pads on the substrate along at least one edge of the chip, the bond pads being between the area for circuit layout and the at least one edge of the chip; and a stress migration test device fabricated as part of the chip, the stress migration test device comprising a conductive runner, the conductive runner having a length sufficient to develop axial stress above the threshold for nucleating voids for the technology in which the runner is fabricated, the conductive runner having a plurality of taps at impedance intervals along the runner, the taps spaced along the runner such that the variation of impedance of the runner between adjacent taps due to presence of a stress migration void in the conductive runner is a detectable portion of the expected impedance between the adjacent taps absent stress migration voids.

33. A chip, comprising:

a substrate having circuits within an area for circuit layout;

bond pads on the substrate along at least one edge of the chip, the bond pads being between the area for circuit layout and the edge of the chip; and at least a portion of a stress migration test device fabricated between the bond pads and the at least one edge of the chip, the stress migration test device comprising a conductive runner, the conductive runner having a length sufficient to develop axial stress above the threshold for nucleating voids for the technology in which the runner is fabricated, the conductive runner having a plurality of taps at impedance intervals along the runner, the taps spaced along the runner such that the variation of impedance of the runner between adjacent taps due to presence of a stress migration void in the conductive runner is a detectable portion of the expected impedance between the adjacent taps absent stress migration voids.

34. A method of determining the presence or absence of stress migration voids in a conductor, comprising the steps of:

fabricating on a substrate a conductive runner having a length sufficient to develop axial stress above the threshold for nucleating voids for the technology in which the runner is fabricated;

providing taps at equal impedance intervals along the runner;

passing a known current through a first portion of the conductive runner between two spaced taps;

measuring the voltage developed across a second portion of the conductive runner due to the known current, the second portion of the conductive runner being a subset of the first portion of the conductive runner;

calculating an impedance of the second portion of the conductive runner;

normalizing the impedance of the second portion of the conductive runner by a nominal impedance to generate an impedance ratio; and comparing the impedance ratio to an impedance ratio threshold to determine whether a stress migration void is present in the second portion of the conductive runner.

35. A method as recited in claim 34, further comprising the steps of:

indexing the two spaced taps defining the first portion of the conductive runner to define a new first portion of the conductive runner;

passing a known current through the new first portion of the conductive runner; and developing an impedance of a new second portion of the conductive runner, the new second portion of the conductive runner being a subset of the new first portion of the conductive runner.

36. A method as recited in claim 35, further comprising the step of:

repeating the indexing, current passing and impedance developing steps until an impedance has been developed for all second portions of the conductive runner.

37. A method as recited in claim 36, further comprising the step of:

generating the nominal impedance from the impedances developed for the second portions of the conductive runner.

38. A method as recited in claim 37, wherein generating a nominal impedance from the impedances developed for the second portions of the conductive runner comprises generating the nominal impedance as an average of the impedances developed for the second portions of the conductive runner.

39. A method of determining the presence or absence of stress migration voids in a conductor, comprising the steps of:

fabricating on a substrate a conductive runner having a length sufficient to develop axial stress above the threshold for nucleating voids for the technology in which the runner is fabricated;

providing taps at impedance intervals along the runner;

passing a known current through a first portion of the conductive runner between two spaced taps;

measuring the voltage developed across a second portion of the conductive runner due to the known current, the second portion of the conductive runner being a subset of the first portion of the conductive runner;

calculating an impedance of the second portion of the conductive runner;

normalizing the impedance of the second portion of the conductive runner by an expected impedance for the second portion of the conductive runner to generate an impedance ratio; and comparing the impedance ratio to an impedance ratio threshold to determine whether a stress migration void is present in the second portion of the conductive runner.

40. A method as recited in claim 39, further comprising the steps of:

indexing the two spaced taps defining the first portion of the conductive runner to define a new first portion of the conductive runner;

passing a known current through the new first portion of the conductive runner; and developing an impedance of a new second portion of the conductive runner, the new second portion of the conductive runner being a subset of the new first portion of the conductive runner.

41. A method as recited in claim 40, further comprising the step of:

repeating the indexing, current passing and impedance developing steps until an impedance has been developed for all second portions of the conductive runner.

* * * * *